United States Patent
Farnworth

(10) Patent No.: US 8,129,847 B2
(45) Date of Patent: Mar. 6, 2012

(54) INTERCONNECT AND METHOD FOR MOUNTING AN ELECTRONIC DEVICE TO A SUBSTRATE

(76) Inventor: Warren M. Farnworth, Nampa, ID (US)

( * ) Notice: Subject to any disclaimer, the term of this patent is extended or adjusted under 35 U.S.C. 154(b) by 149 days.

(21) Appl. No.: 12/615,321

(22) Filed: Nov. 10, 2009

(65) Prior Publication Data

US 2010/0123115 A1    May 20, 2010

Related U.S. Application Data

(60) Provisional application No. 61/199,667, filed on Nov. 20, 2008.

(51) Int. Cl.
*H01L 29/40* (2006.01)
(52) U.S. Cl. .......... 257/778; 257/737; 257/738
(58) Field of Classification Search .......... 438/108, 438/109; 257/778
See application file for complete search history.

(56) References Cited

U.S. PATENT DOCUMENTS

| | | | | |
|---|---|---|---|---|
| 5,328,087 A | * | 7/1994 | Nelson et al. | 228/175 |
| 5,445,308 A | * | 8/1995 | Nelson et al. | 228/121 |
| 6,107,123 A | * | 8/2000 | Distefano et al. | 438/125 |
| 6,359,343 B1 | * | 3/2002 | Langari et al. | 257/789 |
| 6,611,055 B1 | * | 8/2003 | Hashemi | 257/706 |
| 7,221,059 B2 | * | 5/2007 | Farnworth et al. | 257/778 |
| 7,675,182 B2 | * | 3/2010 | Sun et al. | 257/778 |
| 7,772,042 B2 | * | 8/2010 | Kerr et al. | 438/118 |
| 7,824,960 B2 | * | 11/2010 | Hao et al. | 438/109 |
| 2007/0109727 A1 | * | 5/2007 | Edson et al. | 361/600 |

* cited by examiner

*Primary Examiner* — James Mitchell

(57) ABSTRACT

An interconnect for mounting an electronic device to a substrate includes a base layer between the electronic device and the substrate in electrical communication with integrated circuits on the electronic device, a phase change layer on the base layer made of a material which is liquid at normal operating temperatures of the electronic device and a retaining layer surrounding the phase change layer, and configured to retain the phase change layer in liquid form on the base layer. A method for mounting an electronic device to a substrate includes the steps of: forming a base layer on the device (or on the substrate); forming a phase change layer on the base layer; placing the phase change layer in contact with a corresponding electrode on the substrate (or on the device); and then forming a retaining layer between the device and the substrate configured to surround the base layer, the phase change layer, and the electrode, and to retain the phase change layer in liquid form between the base layer and the electrode.

13 Claims, 2 Drawing Sheets

INTERCONNECT AND METHOD FOR MOUNTING AN ELECTRONIC DEVICE TO A SUBSTRATE

CROSS REFERENCE TO RELATED APPLICATIONS

This application claims priority based on US Provisional Application No. 61/199,667 filed Nov. 20, 2008 entitled "Interconnect And Method For Mounting An Electronic Device To A Substrate".

FIELD

This application relates generally to electronic devices, such as semiconductor devices, and to a method for mounting electronic devices to substrates, such as circuit boards.

BACKGROUND

Electronic devices, such as semiconductor dice and packages, are typically mounted to a substrate, such as a circuit board, mother board or a module substrate. Typically, interconnects on the electronic device are bonded to corresponding electrodes on the substrate. For example, the interconnects can comprise bumped bond pads, or terminal contacts such as metal balls, metallurgically bonded to the electrodes on the substrate. One specific type of bonding developed by IBM is known as C4 (controlled collapse chip connection).

One problem that occurs with this type of mounting is thermal stress caused by the CTE (coefficient of thermal expansion) mismatch between the electronic device and the substrate. Thermal stresses can develop as the electronic device heats up during start up and operation, and then cools down during non-use or steady state operation with a cooling device. For example, the thermal stresses can develop in the bonded connections between the interconnects on the electronic device and the electrodes on the substrate. Thermal stresses and heat build up can adversely affect the performance of the electronic device and can cause joint fatigue.

Most electronic systems, such as computers, have cooling devices, such as fans, designed to dissipate the heat generated by the electronic devices. However, these devices may not run continuously, and may take several seconds after start up to reach full capacity. In some situations, heat may build up in the interconnects generating thermal stresses and heat in the electronic devices. The present disclosure is directed to an interconnect, and to a method for mounting an electronic device to a substrate, designed to substantially eliminate thermal stresses and to reduce heat build up.

SUMMARY

An interconnect for mounting an electronic device to a substrate includes a base layer between the electronic device and the substrate in electrical communication with integrated circuits on the electronic device, and a phase change layer on the base layer made of a material which is liquid at normal operating temperatures of the electronic device. The base layer can comprise a metal such as tungsten, or other refractory metal, which does not interact with the phase change layer. The interconnect also includes a retaining layer made of a high temperature material, such as parylene, surrounding the phase change layer, and configured to retain the phase change layer in liquid form on the base layer. The interconnect also includes an electrode on the substrate which is also surrounded by the retaining layer. An alternate embodiment interconnect includes an interconnect layer between the electronic device and the substrate having dispersed particles made of a phase change material.

A method for mounting an electronic device to a substrate includes the steps of: forming a base layer on the device (or on the substrate); forming a phase change layer on the base layer; placing the phase change layer in contact with a corresponding electrode on the substrate (or on the device); and then forming a retaining layer between the device and the substrate configured to surround the base layer, the phase change layer, and the electrode, and to retain the phase change layer in liquid form between the base layer and the electrode.

DETAILED DESCRIPTION OF THE PREFERRED EMBODIMENTS

Figure 1A:
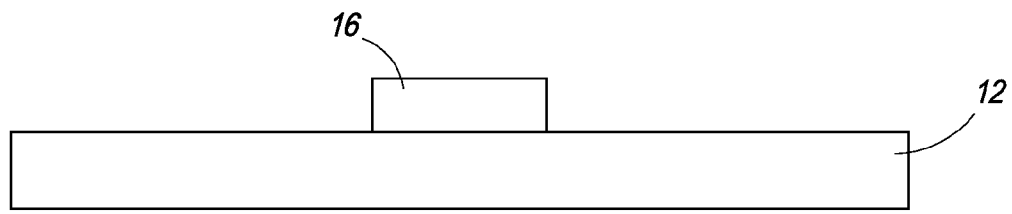
FIGS. 1A-1D are schematic cross sectional drawings illustrating an interconnect and a method for mounting an electronic device to a substrate.

Referring to FIGS. 1A-1D, an interconnect 10 (FIG. 1D), and a method for mounting an electronic device 12 to a substrate 14 (FIG. 1C) are illustrated. Initially, as shown in FIG. 1A, a base layer 16 can be formed on the electronic device 12. Although in the illustrative embodiment, the base layer 16 is initially formed on the electronic device 12, the base layer 16 can alternately be initially formed on the substrate 14.

For an electronic device 12 in the form of a semiconductor die, the base layer 16 can be formed on the bond pads, or on the redistribution pads, in electrical communication with the integrated circuits on the die. For an electronic device 12 in the form of a semiconductor package, the base layer 16 can be formed on the terminal contacts for the package in electrical communication with integrated circuits in the package. The base layer 16 can comprise tungsten, or another refractory metal, formed in a desired pattern and with a desired geometry, using a suitable deposition process, such as electroless deposition or CVD.

Figure 1B:
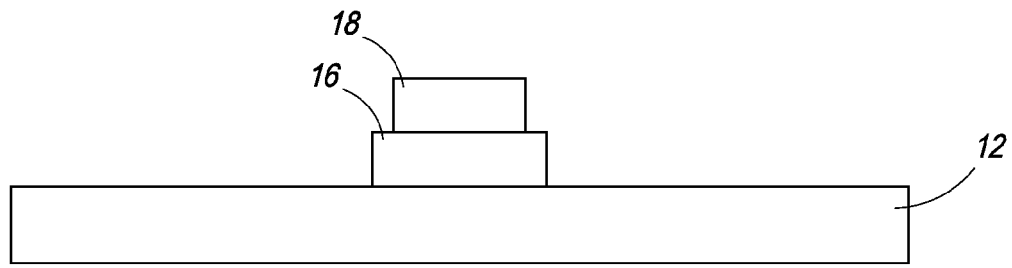

Next, as shown in FIG. 1B, a phase change layer 18 can be formed on the base layer 16. The phase change layer 18 can comprise a low melting point metal that is liquid at the normal operating temperature of the electronic device 12. The phase change layer 18 can be formed in a desired pattern and with a desired geometry, using a suitable deposition process, such as electroless deposition or CVD.

Figure 1C:
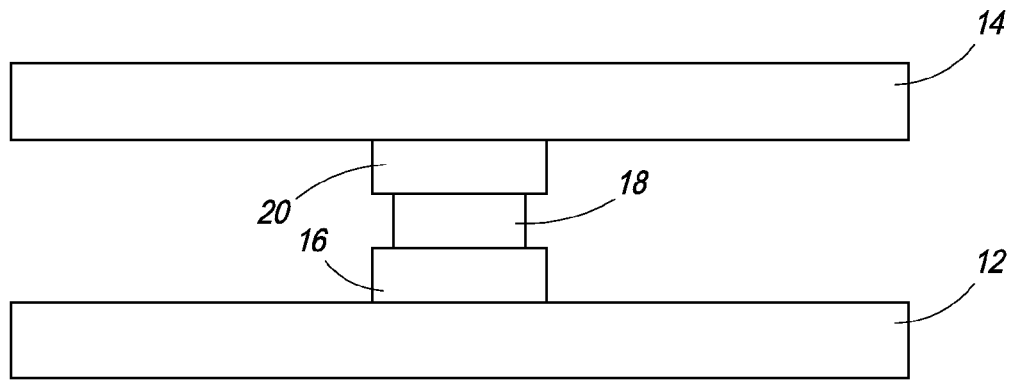

Next, as shown in FIG. 1C, the phase change layer 18 can be placed in contact with electrodes 20 on the substrate 14. For example, the substrate 14 can comprise a circuit board, a mother board, or a module board, and the electrodes 20 can comprise metal pads in electrical communication with outputs for the substrate 14. If desired, the phase change layer 18 can initially be bonded to the electrodes 20 using a suitable process. If the base layer 16 is formed on the electrodes 20 of the substrate 14, rather than on the electronic device 12, the base layer 16 would be placed in contact with bond pads, redistribution pads or terminal contact on the electronic device 12.

Figure 1D:
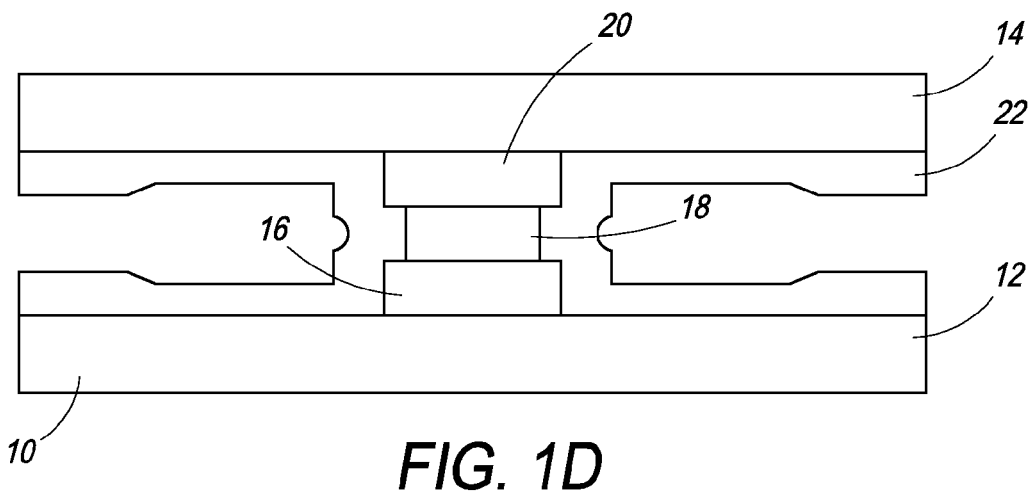

Next, as shown in FIG. 1D, a retaining layer 22 can be formed on the surface of the electronic device 12 and on the surface of the substrate 14. The retaining layer 22 completely surrounds the phase change layer 18, the base layer 16 and the electrode 20, and retains the phase change layer 18 (when in liquid form) between the base layer 16 and the electrode 20. The retaining layer 22 in effect forms a container for containing the phase change layer 18. The retaining layer 22 can comprise a high temperature polymer material, such as parylene, formed using a suitable deposition process such as vapor deposition. As shown in FIG. 1D, the interconnect 10 includes the base layer 16, the phase change layer 28 and the electrode 20, all of which are surrounded by the retaining layer 22, which is configured to form a sealed container for the phase change layer 28 in liquid form.

Figure 2:
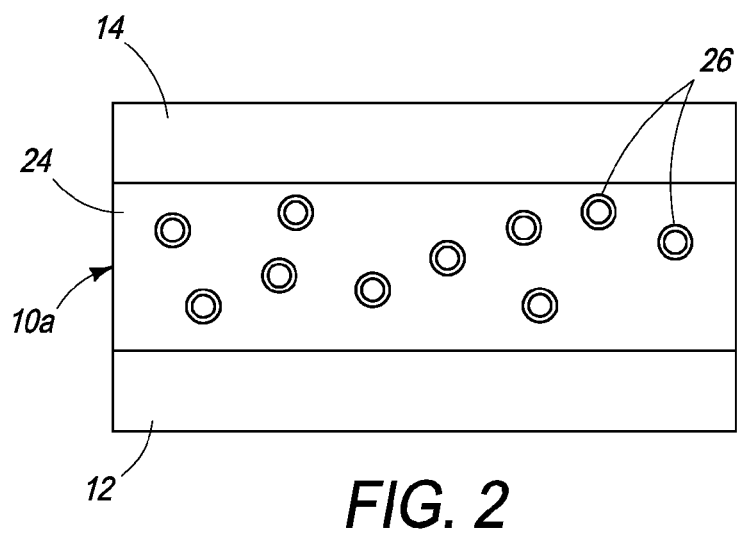
FIG. 2 is a schematic cross sectional drawing of an alternate embodiment interconnect.

Referring to FIG. 2, an alternate embodiment interconnect 10A is illustrated. The interconnect 10A comprises an interconnect layer 24 formed between the electronic device 12 and the substrate 14. The interconnect layer 24 can comprise a polymer compound, such as silicone, having dispersed phase change particles 26 formed therein. The phase change particles 26 can comprise a material configured to go from a solid state to a liquid state at the normal operating temperature of the electronic device 12.

The phase change particles 26 limit the initial temperature rise of the electronic device 12 during start up, and allow the cooling device of a system (e.g., fan) to ramp the temperature down during steady state operation. For example, if the electronic device 12 heats quickly (like a processor or a memory device), the phase change particles 26 in the interconnect layer 24 clamp the temperature at the melting temperature of the phase change particles 26 until all of the material has melted. This time lag allows the cooling device of a system to ramp up to remove heat. The clamping also reduces the expansion of the electronic device 12, since the temperature cannot increase above the phase change temperature of the phase change particles 26, until all of the phase change particles 26 have completely melted.

Figure 3:
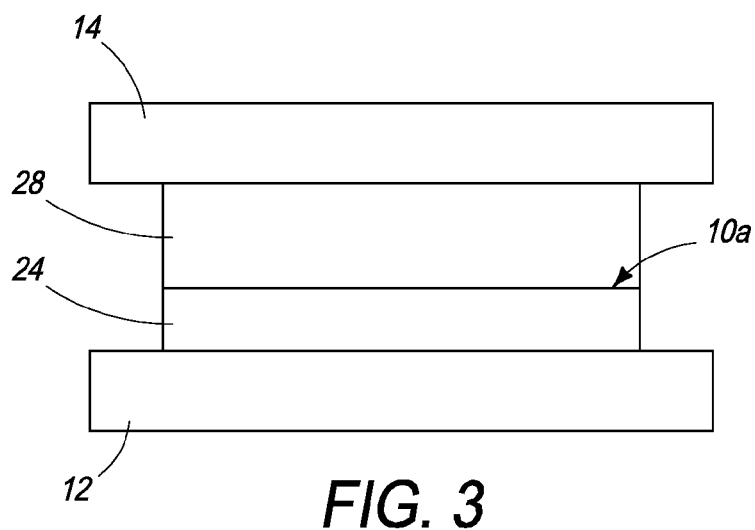
FIG. 3 is a cross sectional view of the alternate embodiment interconnect and an additional heat absorbing layer.

As shown in FIG. 3, the interconnect layer 24 can also be covered with a heat absorbing layer 28, such as a polymer material, to form an even larger thermal reservoir for an even larger time delay.

Thus the disclosure describes an improved interconnect and method for mounting an electronic device to a substrate. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. An interconnect for mounting an electronic device having an electrode, and integrated circuits in electrical communication with the integrated circuits, to a substrate comprising:
a base layer between the electronic device and the substrate in electrical communication with the integrated circuits on the electronic device;
a phase change layer on and above the base layer bonded to the electrode comprising a material which is liquid at a normal operating temperature of the electronic device; and
a retaining layer on the electronic device and the substrate surrounding the phase change layer and the electrode, the retaining layer comprising a polymer configured as a container for retaining the phase change layer in liquid form on the base layer.

2. The interconnect of claim 1 wherein the base layer comprises a refractory metal.

3. The interconnect of claim 1 wherein the base layer comprises tungsten.

4. The interconnect of claim 1 wherein the retaining layer comprises a high temperature polymer.

5. The interconnect of claim 1 wherein the retaining layer comprises parylene.

6. The interconnect of claim 1 wherein the electronic device comprises a processor or a memory device.

7. The interconnect of claim 1 wherein the electronic device comprises a semiconductor device and the substrate comprises a circuit board.

8. A method for mounting an electronic device to a substrate comprising:
forming a base layer on the device or on the substrate;
forming a phase change layer on and above the base layer;
bonding the phase change layer to an electrode on the substrate or on the device; and
following the bonding step, forming a retaining layer between the device and the substrate comprising a polymer configured to surround the base layer, the phase change layer, and the electrode, and to form a container for retaining the phase change layer in liquid form between the base layer and the electrode.

9. The method of claim 8 wherein the base layer comprises a refractory metal.

10. The method of claim 8 wherein the base layer comprises tungsten.

11. The method of claim 8 wherein the retaining layer comprises a high temperature polymer.

12. The method of claim 8 wherein the retaining layer comprises parylene.

13. The method of claim 8 wherein the electronic device comprises a semiconductor device and the substrate comprises a circuit board.

* * * * *